(12) United States Patent
Murata et al.

(10) Patent No.: US 10,818,529 B2
(45) Date of Patent: Oct. 27, 2020

(54) PURGE DEVICE, PURGE STOCKER, AND PURGE METHOD

(71) Applicant: MURATA MACHINERY, LTD., Kyoto-shi, Kyoto (JP)

(72) Inventors: Masanao Murata, Ise (JP); Takashi Yamaji, Ise (JP)

(73) Assignee: MURATA MACHINERY, LTD., Kyoto (JP)

( * ) Notice: Subject to any disclaimer, the term of this patent is extended or adjusted under 35 U.S.C. 154(b) by 388 days.

(21) Appl. No.: 15/755,662

(22) PCT Filed: Jul. 14, 2016

(86) PCT No.: PCT/JP2016/070855
§ 371 (c)(1),
(2) Date: Feb. 27, 2018

(87) PCT Pub. No.: WO2017/038629
PCT Pub. Date: Mar. 9, 2017

(65) Prior Publication Data
US 2020/0227295 A1 Jul. 16, 2020

(30) Foreign Application Priority Data
Aug. 31, 2015 (JP) ................. 2015-170174

(51) Int. Cl.
*H01L 21/673* (2006.01)
*G05D 7/06* (2006.01)
(52) U.S. Cl.
CPC ..... *H01L 21/67389* (2013.01); *G05D 7/0617* (2013.01)

(58) Field of Classification Search
CPC ............. H01L 21/673; H01L 21/67389; H01L 21/67393; G05D 7/0617
See application file for complete search history.

(56) References Cited

U.S. PATENT DOCUMENTS

| 5,433,574 A | * | 7/1995 | Kawano ................... B01L 1/04 414/217 |
| 5,879,458 A | * | 3/1999 | Roberson, Jr. .... H01L 21/67017 118/715 |
| 6,368,411 B2 | * | 4/2002 | Roberson, Jr. .... H01L 21/67017 118/715 |

(Continued)

FOREIGN PATENT DOCUMENTS

| JP | 2006-114582 A | 4/2006 |
| JP | 2010-182747 A | 8/2010 |

OTHER PUBLICATIONS

Official Communication issued in International Patent Application No. PCT/JP2016/070855, dated Sep. 27, 2016.

(Continued)

*Primary Examiner* — Nicolas A Arnett
(74) *Attorney, Agent, or Firm* — Keating & Bennett, LLP (57) ABSTRACT

A purge device capable of appropriately purging a container while saving purge gas includes a first purge nozzle that supplies a purge gas to a container to be purged, an internal state detector capable of detecting an internal state of the container before a purging process with the first purge nozzle is started, and a purge determiner that determines purge conditions for the container based on a detection result from the internal state detector.

9 Claims, 8 Drawing Sheets

(56) References Cited

U.S. PATENT DOCUMENTS

| | | | |
|---|---|---|---|
| 6,996,453 B2* | 2/2006 | Ahn | H01L 21/67017 |
| | | | 700/213 |
| 9,212,786 B2* | 12/2015 | Naylor | H01L 21/67393 |
| 9,312,152 B2* | 4/2016 | Rebstock | H01L 21/67393 |
| 9,460,949 B2* | 10/2016 | Chou | H01L 21/67393 |
| 9,607,873 B2* | 3/2017 | Liao | H01L 21/67389 |
| 9,645,000 B2* | 5/2017 | Murata | H01L 21/67769 |
| 10,325,794 B2* | 6/2019 | Murata | H01L 21/67389 |
| 10,347,517 B2* | 7/2019 | Smith | H01L 21/67393 |
| 10,586,721 B2* | 3/2020 | Murata | H01L 21/67393 |
| 10,607,872 B2* | 3/2020 | Tanaka | H01L 21/67288 |
| 2007/0144118 A1* | 6/2007 | Alvarez, Jr. | H01L 21/67017 |
| | | | 55/385.1 |
| 2009/0272461 A1* | 11/2009 | Alvarez, Jr. | H01L 21/67389 |
| | | | 141/64 |
| 2013/0000757 A1* | 1/2013 | Yoshimura | H01L 21/67772 |
| | | | 137/561 R |
| 2015/0380288 A1 | 12/2015 | Hirano | |

OTHER PUBLICATIONS

Official Communication issued in International Patent Application No. PCT/JP2016/070855, dated Mar. 15, 2018.

* cited by examiner

PURGE DEVICE, PURGE STOCKER, AND PURGE METHOD

BACKGROUND OF THE INVENTION

1. Field of the Invention

The present invention relates to a purge device, a purge stocker, and a purge method.

2. Description of the Related Art

A purge stocker stores therein containers. The containers are able to contain various kinds of articles such as wafers and reticles. Examples of the containers include FOUP, SMIF Pod, and reticle Pod. For storage of the containers, the purge stocker fills a purge gas such as clean dry air or nitrogen gas into the container by a purge device to suppress contamination or oxidation of contained matters. It is expected for the purge device to be able to save a purge gas (see, for example, Japanese Patent Application Publication No. 2010-182747). Japanese Patent Application Publication No. 2010-182747 recites that a leaving step for leaving a container without supplying a purge gas to the container is provided in a safety period during which oxygen gas or dust is not apt to flow in the container again, and a purge step for rapidly purging the container and the leaving step are alternatingly performed. This safety period is experimentally set depending on the type of FOUP and conditions of clean room environments or discriminated by a control device based on a result of measuring a partial pressure of oxygen gas with a sensor provided in the FOUP.

In a container when carried in the purge device, for example, a purge gas may leak with an amount corresponding to a time that has elapsed from the previous purging. Thus, the loading of the purge gas is sufficient in some cases and insufficient in other cases. If the supply amount of the purge gas in the current purging is set to be small with reference to a container that is carried in with sufficient loading of the purge gas, the effect of purging on a container that is carried in with insufficient loading of the purge gas becomes insufficient. On the other hand, if the supply amount of the purge gas in the current purging is set to be large with reference to a container that is carried in with insufficient loading of the purge gas, the amount of wasted purge gas is larger than that of a container that is carried in with sufficient loading of the purge gas. As described above, it is not easy for the conventional technology to appropriately purge a container while saving the purge gas.

SUMMARY OF THE INVENTION

Preferred embodiments of the present invention provide purge devices, purge stockers, and purge methods capable of appropriately purging a container while saving purge gas.

A purge device according to a preferred embodiment of the present invention includes a first purge nozzle that supplies a purge gas to a container to be purged; an internal state detector that detects an internal state of the container before a purging process with the first purge nozzle is started; and a purge determiner that determines purge conditions for the container based on a detection result from the internal state detector.

Furthermore, in a purge device according to a preferred embodiment of the present invention, the internal state detector may detect the internal state of the container based on a composition of an exhaust gas that is discharged from the container when the purge gas is supplied to the container. Furthermore, in the purge device, the internal state detector may detect a concentration of moisture or oxygen in the exhaust gas, and may detect the internal state of the container based on a detection result of the concentration. Furthermore, the purge device may include a second purge nozzle that is provided in a conveyance path of the container to a purge position at which the container and the first purge nozzle are connected to each other and that supplies a purge gas to the container, the internal state detector may detect the internal state of the container based on a composition of the exhaust gas when the purge gas is supplied through the second purge nozzle to the container, and the purge determiner may determine conditions for supplying the purge gas through the first purge nozzle as the purge conditions. Furthermore, the purge device may include a flow rate control device that controls a flow rate of the purge gas supplied through the first purge nozzle to the container, and the purge determiner may control the flow rate control device based on the determined purge conditions. Furthermore, in the purge device, the purge conditions may include a flow rate and a supply time of the purge gas supplied through the first purge nozzle to the container.

A purge stocker according to a preferred embodiment of the present invention includes an internal state detector that is provided to a loading port through which a container to be purged is carried in and that is capable of detecting an internal state of the container; a purge determiner that determines purge conditions for the container based on a detection result from the internal state detector; and a shelf that holds the container purged based on the purge conditions.

A purge method according to a preferred embodiment of the present invention includes supplying a purge gas to a container to be purged through a first purge nozzle; detecting an internal state of the container before a purging process with the first purge nozzle is started; and determining purge conditions for the container based on a detection result of the internal state of the container.

According to preferred embodiments of the present invention, an internal state of a container is detected before a purging process with a first purge nozzle is started, and purge conditions for the container are determined based on a detection result of the internal state. Consequently, it is possible to purge the container under purge conditions suited for the internal state of the container, and appropriately purge the container while saving the purge gas.

Furthermore, a purge device according to a preferred embodiment of the present invention in which the internal state detector is capable of detecting the internal state of the container based on a composition of an exhaust gas that is discharged from the container when the purge gas is supplied to the container is able to detect the internal state from outside the container, and is thus able to reduce cost because it requires no sensor for each container, for example. Furthermore, the purge device in which the internal state detector is capable of detecting a concentration of moisture or oxygen in the exhaust gas, and detecting the internal state of the container based on a detection result of the concentration is able to discriminate the amount of the purge gas to be supplied to the container based on the concentration of moisture or oxygen in the exhaust gas, for example, and is thus able to remarkably reduce a wasted purge gas to appropriately purge the container. Furthermore, the purge device that includes a second purge nozzle that is provided in a conveyance path of the container to a purge position at which the container and the first purge nozzle are connected to each other and that supplies a purge gas to the container, and in which the internal state detector is capable of detecting the internal state of the container based on a composition of the exhaust gas when the purge gas is supplied through the second purge nozzle to the container, and the purge determiner determines conditions for supplying the purge gas through the first purge nozzle as the purge conditions is able to share the second purge nozzle among a plurality of containers to be conveyed to the purge position, and is thus able to reduce device cost, for example.

Furthermore, a purge device according to a preferred embodiment of the present invention that includes a flow rate control device that controls a flow rate of the purge gas supplied through the first purge nozzle to the container and in which the purge determiner controls the flow rate control device based on the determined purge conditions is able to control a supply amount of the purge gas by the flow rate control device with high accuracy, and is thus able to control the state of purging in the container with high accuracy. Furthermore, the purge device in which the purge conditions include a flow rate and a supply time of the purge gas supplied through the first purge nozzle to the container is able to control a time history of the supply amount of the purge gas, and is thus able to control the state of purging in the container with high accuracy.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments are described below with reference to the drawings. In each of the figures referred to below, an XYZ coordinate system is used to describe the directions in the figure. In the XYZ coordinate system, the vertical direction is a Z direction, and the horizontal directions are an X direction and a Y direction.

First Preferred Embodiment

Figure 1:
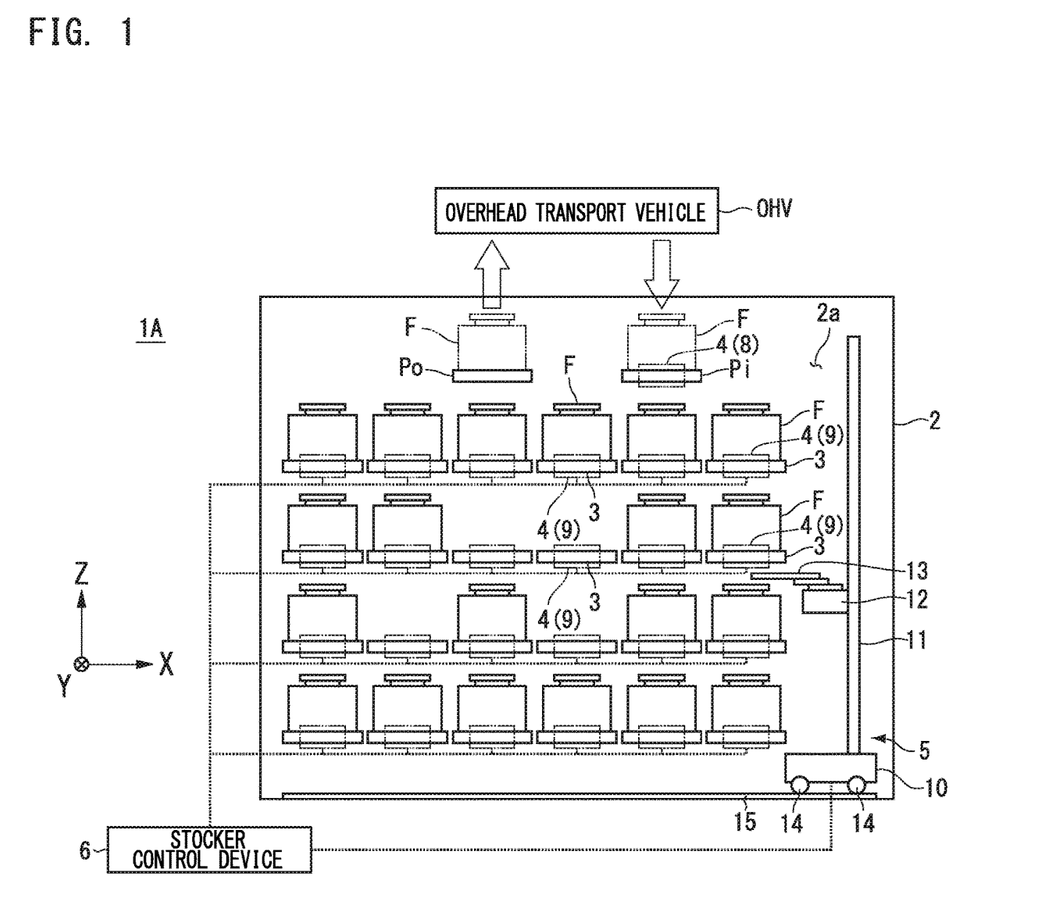
FIG. 1 is a diagram illustrating a purge stocker according to a first preferred embodiment of the present invention.

FIG. 1 is a diagram illustrating an example of a purge stocker 1A according to the present preferred embodiment. The purge stocker 1A is, for example, an automatic warehouse that stores therein containers F to contain articles such as wafers and reticles used for manufacturing of semiconductor elements. Examples of the containers F include FOUP, SMIF Pod, and reticle Pod. Reticles may be used for a liquid immersion exposure device or may be used for an EUV exposure device, for example.

As illustrated in FIG. 1, the purge stocker 1A includes a casing 2, a plurality of storage shelves 3, a plurality of purge devices 4, a stacker crane (conveyance device) 5, and a stocker control device 6. The casing 2 includes an internal space 2a that is isolatable from the outside. The casing 2 includes a loading and unloading port (loading port Pi, unloading port Po) through which a container F is received from an overhead transport vehicle OHV. The overhead transport vehicle OHV transfers a container F to be stored in the purge stocker 1A to the loading port Pi, and receives a container F to be carried out from the purge stocker 1A from the unloading port Po. The overhead transport vehicle OHV conveys the container F between a processing device such as an exposure device and the purge stocker 1A.

The storage shelves 3, the purge devices 4, and the stacker crane 5 are arranged in the internal space 2a in the casing 2. The stocker control device 6 may be disposed inside or outside the casing 2. The stocker control device 6 controls the purge devices 4 and the stacker crane 5. Note that a control device that controls the purge device 4 and a control device that controls the stacker crane 5 may be separately provided.

The stacker crane 5 is able to convey the container F in each of the X direction, the Y direction, and the Z direction, and is, for example, able to convey the container F between a loading port Pi and a storage shelf 3, between a storage shelf 3 and another storage shelf 3, and between a storage shelf 3 and an unloading port Po. The stacker crane 5 includes, for example, a traveling carriage 10, a support column 11, a support base 12, and a transfer device 13. The traveling carriage 10 includes a plurality of wheels 14, and moves in the horizontal direction (X direction) along a rail 15 provided on the bottom surface of the casing 2.

The support column 11 extends from the top surface of the traveling carriage 10 in the vertical direction (Z direction). The support base 12 is supported by the support column 11, and is slidable in the Z direction along the support column 11. The transfer device 13 includes, for example, an extendable arm and a mount having a top surface on which a container F is placeable. Note that, the stacker crane 5 may grip a flange 23 (see FIG. 1) on top of the container F, for example, and convey the container F while suspending the container F or may convey the container F while gripping a side surface of the container F, instead of having the container F mounted on the stacker crane 5. Furthermore, although FIG. 1 illustrates one stacker crane 5, the number of the stacker cranes 5 arranged in the casing 2 may be two or more.

The storage shelves 3 are arranged in a plurality of stages in the height direction (Z direction) and arranged in a plurality of rows in the horizontal direction (X direction). The storage shelves 3 are each able to have a container F placed thereon. The storage shelves 3 are each a shelf that is able to hold a container F purged by the purge device 4. Note that some storage shelves 3 may have no containers F placed thereon depending on the storage conditions of containers F.

The purge device 4 includes an internal state detector 8 provided to the loading port Pi and a purge main body 9 provided to the storage shelf 3 (illustrated also in FIG. 2 referred to later). The internal state detector 8 detects an internal state of the container F before a purging process. The purge main body 9 performs a purging process on the container F based on the detection result from the internal state detector 8. The purge main body 9 is provided for each purge device 4 and provided for each of the storage shelves 3. The internal state detector 8 is used in common (shared) for the purge devices 4.

Figure 2:
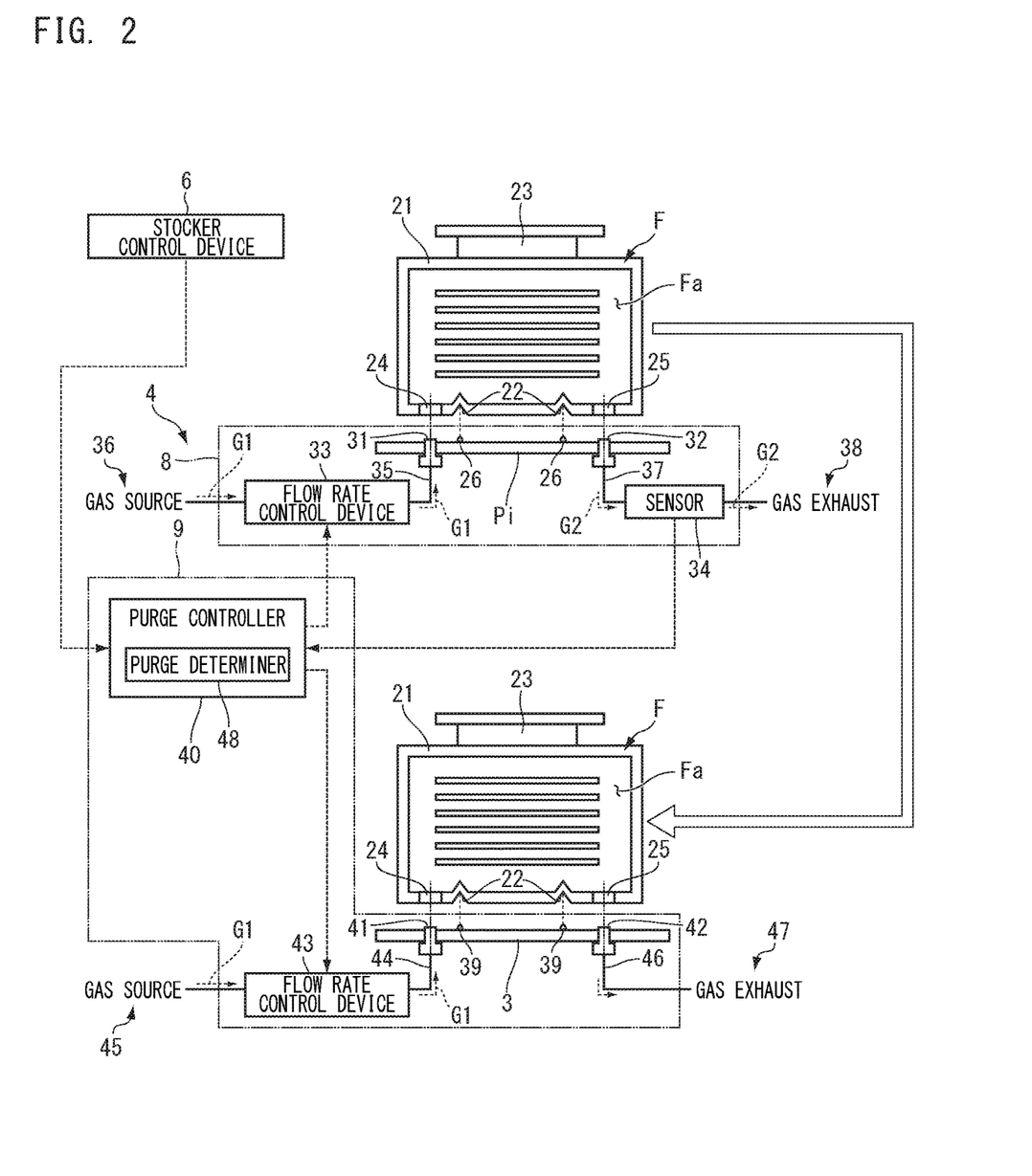
FIG. 2 is a diagram illustrating a purge device according to the first preferred embodiment of the present invention.

FIG. 2 is a diagram illustrating the purge device 4 according to the present preferred embodiment. FIG. 2 illustrates FOUP as an example of the container F. The container F includes a box-shaped main body 21 including an opening (not shown) in the front surface and a lid (not shown) that closes this opening. An article such as a wafer is contained in an interior Fa (internal space, containing space) of the container F through the opening of the main body 21. The flange 23 is provided on top of the main body 21. The main body 21 has, on its bottom surface side, recesses 22 that perform positioning. Examples of the recesses 22 include grooves that radially extend from the center of the bottom surface of the main body 21. Positioning pins (not shown) provided to a mounting table of the transfer device 13 are to be fitted into the recesses 22 such that the container F is positioned with respect to the mounting table of the transfer device 13 when the container F is conveyed by the transfer device 13.

The main body 21 of the container F includes, on the bottom surface side, a gas introduction port 24 and a gas exhaust port 25. For example, an introduction port, a filter, and a check valve are provided in the gas introduction port 24. The introduction port communicates with the interior Fa in the main body 21 and the outside. The inside of the introduction port is a flow path for a purge gas G1 supplied to the interior Fa in the container F, and the filter is provided in the flow path. The filter is, for example, a particle filter, and removes dust included in the gas passing through the introduction port. The check valve in the gas introduction port 24 prevents the gas from flowing out to the outside from the interior Fa in the container F through the introduction port.

For example, an exhaust port, a check valve, and a filter are provided in the gas exhaust port 25. The exhaust port communicates with the interior Fa in the main body 21 and the outside. The gas in the interior Fa in the container F is discharged to the outside of the container F through the exhaust port. The check valve in the gas exhaust port 25 prevents the gas from flowing in the interior Fa from the outside of the container F through the exhaust port. The filter is, for example, a particle filter, and removes dust included in the gas passing through the exhaust port. In an exhaust gas G2 discharged from the exhaust port, the ratio of atmosphere gas in the interior Fa in the container F before purging is high at the timing immediately after the start of purging, and the ratio of the purge gas G1 becomes higher as time has elapsed from the start of purging.

The internal state detector 8 detects an internal state of the container F placed on the loading port Pi. In the loading port Pi, the positioning pins 26 are provided at the position of the internal state detector 8. When the container F is carried in at the position of the internal state detector 8 (loading port Pi), the pins 26 enter the recesses 22, and the container F is positioned with respect to the internal state detector 8. The internal state detector 8 includes a purge nozzle 31 (second purge nozzle), an exhaust nozzle 32, a flow rate control device 33, and a sensor 34. When the container F is disposed on the internal state detector 8, the pins 26 enter the recesses 22 in the container F, and the container F is positioned with respect to the internal state detector 8.

The purge nozzle 31 and the exhaust nozzle 32 are provided on a surface of the loading port Pi on which the container F is to be placed. The purge nozzle 31 and the exhaust nozzle 32 are arranged so as to be connected to the introduction port and the exhaust port in the container F, respectively, when the container F is placed on the loading port Pi. When the container F is placed on the loading port Pi, the introduction port in the container F is connected to a pipe 35 through the purge nozzle 31, and is further connected to a gas source 36 through the flow rate control device 33. The exhaust nozzle 32 is connected to an exhaust path (gas exhaust 38) for the purge gas through a pipe 37. The sensor 34 is connected to the pipe 37, and detects the concentration of a substance to be removed included in the exhaust gas G2 flowing through the pipe 37. The substance to be removed is a substance to be removed from inside the container F by a purging process, and is, for example, oxygen or moisture.

The gas source 36 supplies the purge gas G1. The type of the purge gas G1 is selected depending on matters contained in the container F. For example, gas to suppress oxidation and molecular contamination of contained matters or gas to reduce moisture inside the container F is used. For example, when a contained matter is a silicon wafer, inactive gas such as nitrogen gas is used as the purge gas G1. When nitrogen gas is supplied to the interior Fa in the container F, the atmosphere gas containing oxygen is discharged (removed) to the outside from inside the container F, and the silicon wafer is significantly reduces or prevented from being oxidized.

Furthermore, when a contained matter is a reticle, dry gas such as clean dry air (CDA) is used as the purge gas G1. When the clean dry air is supplied to the interior Fa in the container F, the atmosphere gas containing moisture is discharged (removed) to the outside from inside the container F, and moisture is significantly reduced or prevented from adhering to the reticle. The gas source 36 may be a part of the purge stocker 1A, or may be a device outside the purge stocker 1A. For example, the gas source 36 may be a facility in a factory where the purge stocker 1A is provided.

The flow rate control device 33 controls the flow rate of the purge gas G1 in the pipe 35 connected to the container F (flow path between the introduction port in the container F and the gas source 36). Examples of the flow rate control device 33 include a mass flow controller. The flow rate control device 33 has a flow path therein through which the purge gas G1 flows. In the flow path inside the flow rate control device 33, for example, a flow rate control valve such as a flowmeter using a self-heat generating resistor or an electromagnetic valve is provided. The flow rate control device 33 performs feedback control of the electromagnetic valve on the basis of the measurement result of the flowmeter, and controls the flow rate of the purge gas G1 inside the flow rate control device 33 to approach a target value. By controlling the flow rate of the purge gas in the pipe 35 by the flow rate control device 33, the flow rate of the purge gas G1 supplied from the gas source 36 to the purge nozzle 31 is controlled.

The flow rate control device 33 is communicably connected to a purge controller 40, and controls the flow rate (including ON/OFF) of the purge gas G1 based on a control signal supplied from the purge controller 40. Note that the internal state detector 8 is not necessarily required to include the flow rate control device 33, and, for example, instead of the flow rate control device 33, a valve that switches whether to cause the purge gas to flow at a predetermined flow rate may be provided. This valve is controlled by the purge controller 40 to switch whether to cause the purge gas G1 to flow through the pipe 35.

After the internal state of the container F is detected by the internal state detector 8, the container F is conveyed to the storage shelf 3 by the stacker crane 5 (see FIG. 1). The purge main body 9 performs a purging process on the container F placed on the storage shelf 3. The storage shelf 3 includes a cutout (not shown) that allows a mounting table of the transfer device 13 to pass therethrough in the vertical direction. The transfer device 13 causes the mounting table to move downward from above the storage shelf 3 through the cutout, thus transferring the container F onto the top surface of the storage shelf 3. Positioning pins 39 are provided on the top surface of the storage shelf 3. When the container F is placed on the storage shelf 3, the pins 39 on the top surface of the storage shelf 3 enter the recesses 22 in the container F, and the container F is positioned with respect to the storage shelf 3.

The purge main body 9 includes the purge controller 40, a purge nozzle 41, an exhaust nozzle 42, and a flow rate control device 43. The purge nozzle 41 and the exhaust nozzle 42 are provided on the top surface of the storage shelf 3. The purge nozzle 41 and the exhaust nozzle 42 are arranged so as to be connected to the introduction port and the exhaust port, respectively, when the container F is placed on the storage shelf 3. When the container F is placed on the storage shelf 3, the introduction port in the container F is connected to a pipe 44 through the purge nozzle 41, and is further connected to a gas source 45 through the flow rate control device 43.

Similarly to the gas source 36, the gas source 45 supplies the purge gas G1. The gas source 45 may be common to the gas source 36, or may be provided separately from the gas source 36. The flow rate control device 43 controls the flow rate of the purge gas G1 in the pipe 44 connected to the container F (flow path between the introduction port in the container F and the gas source 45). Examples of the flow rate control device 43 include a mass flow controller, and the flow rate control device 43 may be similar to the above-mentioned flow rate control device 33. The flow rate control device 43 is communicably connected to the purge controller 40, and controls the flow rate of the purge gas G1 based on a control signal supplied from the purge controller 40. The exhaust nozzle 42 is connected to an exhaust path (gas exhaust 47) for the purge gas through a pipe 46.

The purge controller 40 is communicably connected to the stocker control device 6. The purge controller 40 acquires information on conveyance of the container F to the loading port Pi from the stocker control device 6. When the container F is placed at the position of the internal state detector 8 in the loading port Pi, the purge controller 40 controls the flow rate control device 33 in the internal state detector 8 to start the supply of the purge gas G1 to the container F. Furthermore, the purge controller 40 is communicably connected to the sensor 34 in the internal state detector 8, and acquires the detection result of the internal state of the container F (for example, the moisture concentration or the concentration of oxygen in the exhaust gas G2) from the sensor 34.

The purge controller 40 includes a purge determiner 48. The purge determiner 48 determines purge conditions for the container F based on the detection result from the internal state detector 8. Furthermore, the purge controller 40 acquires information on conveyance of the container F to the purge main body 9 from the stocker control device 6. When the container F is placed at the position of the purge main body 9 in the storage shelf 3, the purge controller 40 controls the flow rate control device 43 in the purge main body 9 to execute a purging process based on the purge conditions determined by the purge determiner 48. In this manner, the internal state detector 8 detects the internal state of the container F before the purging process with the purge nozzle 41 (first purge nozzle) is started.

Figure 3:
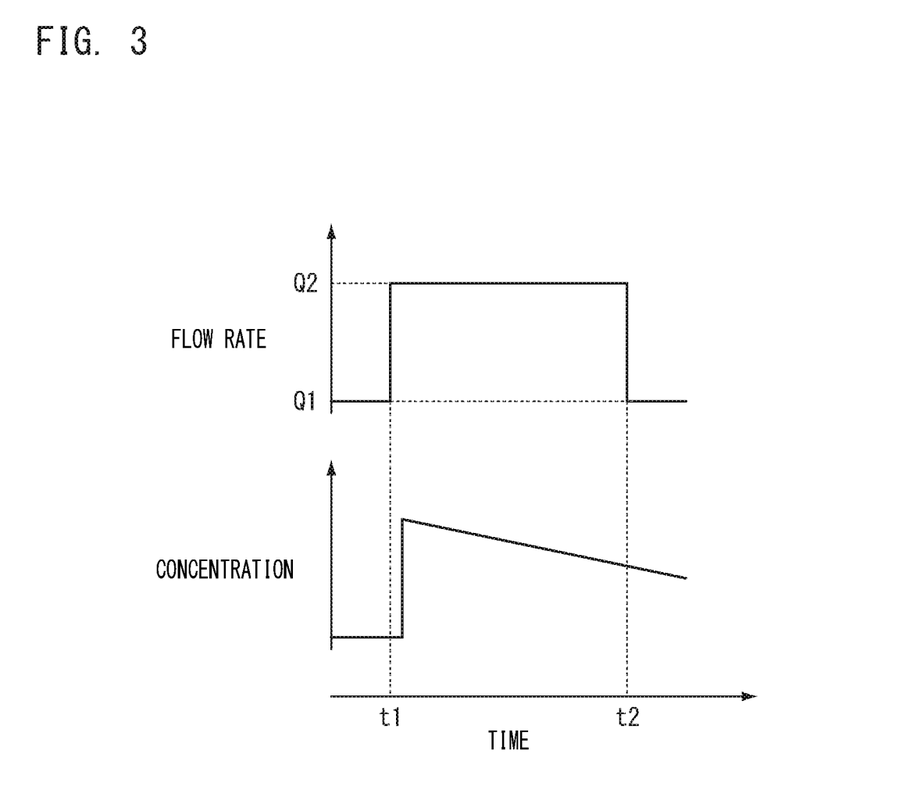
FIG. 3 is a diagram illustrating operation of an internal state detector.

Next, the operation of the internal state detector 8 is described with reference to FIG. 2 and FIG. 3. FIG. 3 is a diagram illustrating the operation of the internal state detector 8. After the purge nozzle 31 in the internal state detector 8 is connected to the container F, the flow rate control device 33 switches the flow rate of the purge gas G1 from Q1 to Q2 at time t1. Q1 is the smallest supply flow rate (for example, 0), and Q2 is a flow rate determined in advance to be larger than Q1. After the time t1, when the inner pressure in the container F becomes equal to or more than a threshold, the exhaust gas G2 is discharged through the gas exhaust port 25, and the sensor 34 detects the concentration of a substance to be removed included in the exhaust gas G2.

When time has further elapsed, the amount of the substance to be removed in the interior Fa in the container F reduces, and the concentration of the substance to be removed in the exhaust gas G2 reduces. At time t2 after a predetermined time has elapsed from the time t1, the flow rate control device 33 switches the flow rate of the purge gas from Q2 to Q1. The supply amount of the purge gas G1 supplied to the container F in the period from the time t1 to the time t2 is the product of the period between the time t1 and the time t2 and Q2. The supply amount is freely set within the range that enables the composition of the exhaust gas G2 to be detected by the sensor 34. Specifically, the supply amount is set to a level at which the exhaust gas G2 is discharged from the container F to the pipe 37 and the exhaust gas G2 reaches the sensor 34. The supply amount of the purge gas G1 for the detection of the internal state is set to be smaller than the supply amount of the purge gas G1 in the purging process with the purge main body 9.

Figure 4A:
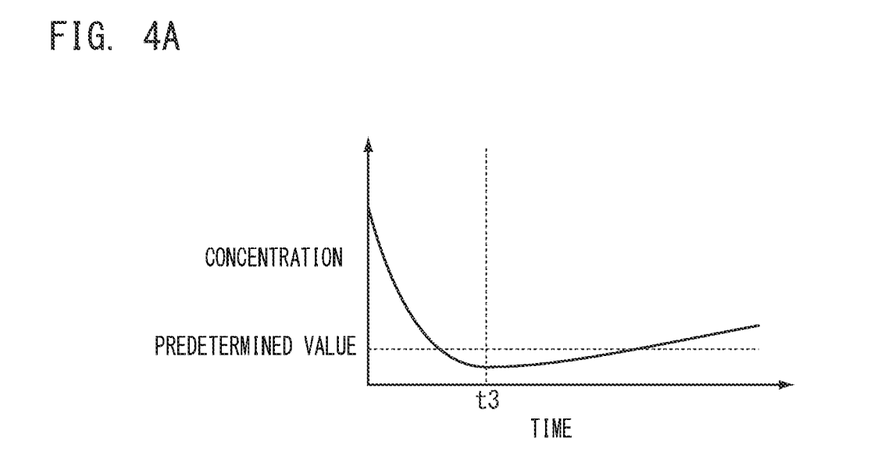
FIGS. 4A to 4C are explanatory diagrams of purge conditions.
Figure 4B:
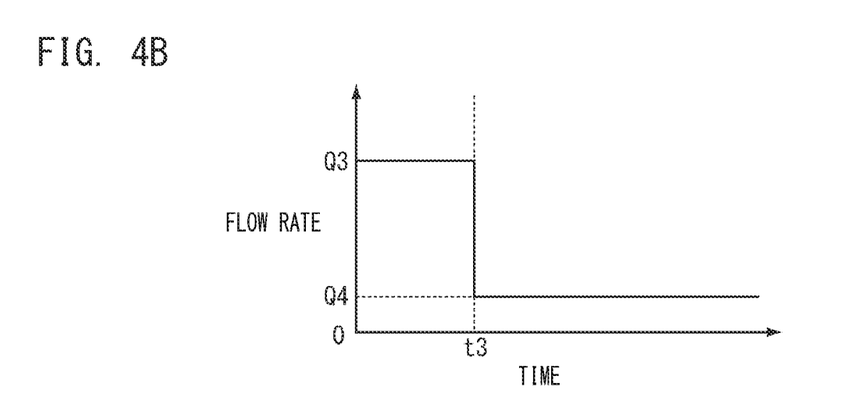
Figure 4C:
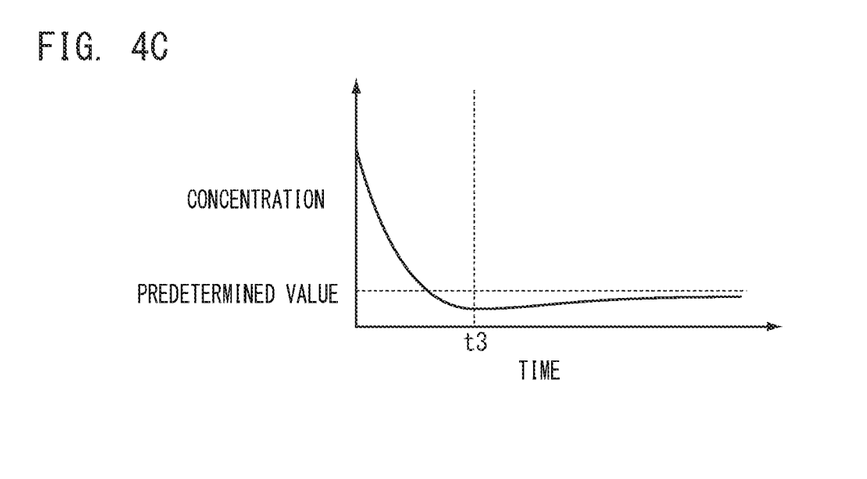

Next, the operation of the purge main body 9 is described with reference to FIG. 2, FIGS. 4A to 4C, and FIGS. 5A and 5B. FIGS. 4A to 4C include explanatory diagrams of purge conditions in the purge main body 9. In FIG. 4A, a time history of the concentration of a substance to be removed is conceptually illustrated. In FIG. 4A, the horizontal axis represents a time from the start of the supply of the purge gas G1, and the vertical axis represents the concentration of a substance to be removed inside the container F. Here, it is assumed that after the supply of the purge gas G1 is started, the supply of the purge gas G1 is stopped at time t3. The concentration of the substance to be removed reduces from the start of the supply of the purge gas G1 until the time t3, and after the time t3, gradually increases with time due to leakage of the purge gas G1 from the container F and entry of the substance to be removed into the container F. Here, it is assumed that the purge gas is supplied at a predetermined flow rate to perform initial purging until the concentration of the substance to be removed becomes equal to or lower than a predetermined value, and subsequently, the flow rate of the purge gas is changed to perform maintaining purging so as to maintain the concentration of the substance to be removed to be equal to or lower than the predetermined value (target value).

FIG. 4B is a diagram illustrating a time history of the flow rate of the purge gas G1 in the purge main body 9, and FIG. 4C is a diagram illustrating a time history of the concentration of a substance to be removed corresponding to FIG. 4B. The horizontal axis in FIG. 4B and FIG. 4C is the time from when the purge main body 9 starts the supply of the purge gas G1. The flow rate control device 43 sets the flow rate to Q3 at the time of the start of the supply of the purge gas G1, and switches the flow rate to Q4 at time t3. Q4 is a freely set amount larger than 0, and is, for example, the same level as the amount of the purge gas G1 that leaks from the container F in unit time. In this manner, the amount of the purge gas in the interior Fa in the container F is maintained, and as illustrated in FIG. 4C, the concentration of the substance to be removed gradually approaches a predetermined value after the time t3. In the first preferred embodiment, the purge controller 40 adjusts at least one of Q3 (flow rate) and t3 (supply time) in FIG. 4B as purge conditions based on the detection result from the internal state detector 8.

Figure 5A:
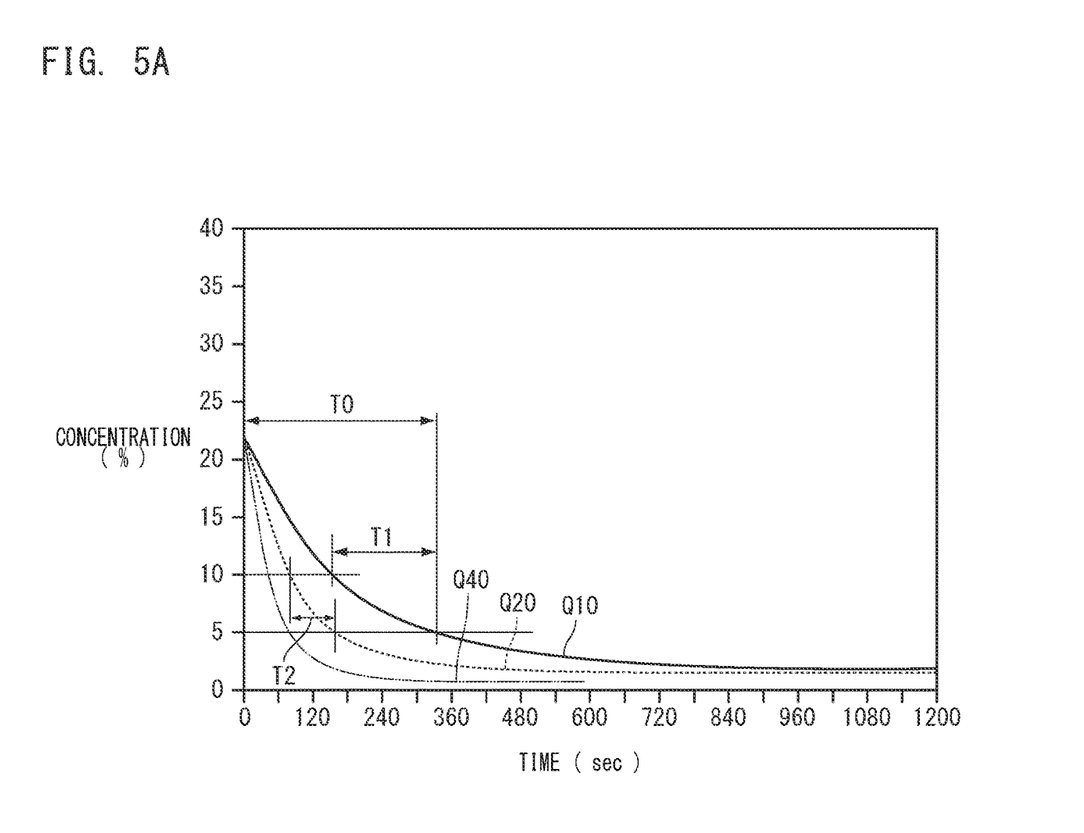
FIGS. 5A and 5B are explanatory diagrams of a method of determining purge conditions.
Figure 5B:
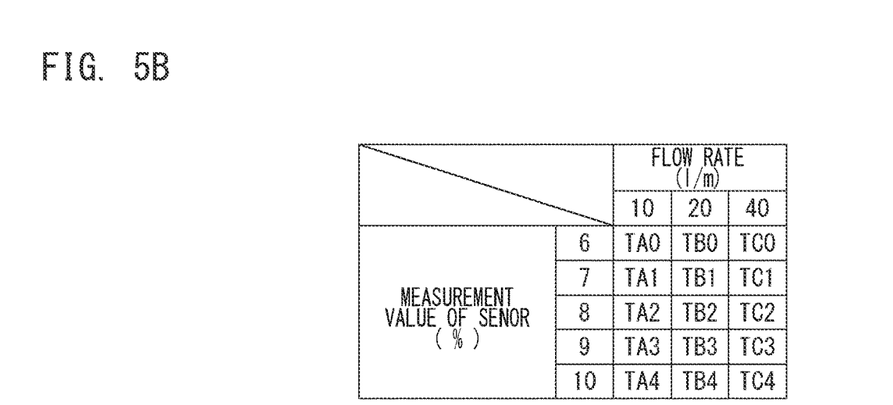

FIGS. 5A and 5B include explanatory diagrams of a method of determining purge conditions. In FIG. 5A, the vertical axis represents the concentration (for example, humidity) of a substance to be removed (for example, moisture), and the horizontal axis represents the supply time of the purge gas G1. Symbols Q10, Q20, and Q40 represent that the flow rates of the purge gas G1 (corresponding to Q3 in FIG. 4B) are about 10 liters per minute (l/m), about 20 liters per minute (l/m), and about 40 liters per minute (l/m), for example. Here, for the sake of description, it is assumed that the concentration of a substance to be removed detected by the sensor 34 in the internal state detector 8 is about 10%, and a target value (predetermined value in FIG. 4C) of the concentration of the substance to be removed is about 5%, for example. Furthermore, it is assumed that the concentration of the substance to be removed is about 22% when a purging process is not performed in advance, for example.

In the case where the internal state of the container F when the purging process is started is unknown, purge conditions are set on the assumption that the concentration of the substance to be removed is about 22%, and when the flow rate is about 10 liters per minute, a supply time T0 necessary for the concentration of the substance to be removed to be equal to or lower than the predetermined value is about 330 seconds, for example. On the other hand, in the case where the internal state of the container F has already been known by the internal state detector 8 (for example, the detection result from the sensor 34 is about 10%), when the flow rate is about 10 liters per minute, a supply time T1 necessary for the concentration of the substance to be removed to be equal to or lower than the predetermined value is about 180 seconds, and the supply time T1 is shorter than the supply time T0, for example. Here, the flow rates corresponding to the supply times T0 and T1 are the same, and by reducing the supply time of the purge gas G1, the supply amount of the purge gas G1 is able to be saved.

In light of such viewpoints, for example, the purge determiner 48 sets the flow rate of the purge gas to a predetermined value (for example, about 10 liters per minute), and sets the supply time of the purge gas G1 to T1 or more and less than T0. In this manner, the supply amount of the purge gas G1 is able to be saved while the effects of the purging process are maintained. When the supply time of the purge gas G1 is set to T1, the supply amount of the purge gas G1 is able to be significantly reduced or minimized while the effects of the purging process are maintained. However, the supply time of the purge gas G1 may be set to be longer than T1 within the range of less than T0 so as to provide an appropriate margin.

Note that the purge determiner 48 may adjust the flow rate and the supply time of the purge gas G1. For example, when the flow rate is about 20 liters per minute (see symbol Q20), a supply time T2 necessary for the concentration of the substance to be removed to be equal to or lower than the predetermined value is about 80 seconds, for example. When the flow rate is about 10 liters per minute and the supply time is T0 (for example, about 330 seconds), the supply amount of the purge gas G1 is about 55 liters, but when the flow rate is about 20 liters per minute and the supply time is T2 (for example, about 80 seconds), the supply amount of the purge gas G1 is about 27 liters, which enables the supply amount to be saved, for example.

As illustrated in FIG. 5A, the purge determiner 48 determines purge conditions based on information indicating the relation between the supply time of the purge gas G1 and the concentration of the substance to be removed. For example, the purge determiner 48 may calculate the supply time T1 or T2 by using a mathematical expression indicating the relation between the supply time of the purge gas G1 and the concentration of the substance to be removed. Furthermore, the purge determiner 48 may determine purge conditions by referring to reference information in which the measurement value of the sensor 34, the flow rate of the purge gas G1, and the supply time of the purge gas G1 are associated with each other.

FIG. 5B is a conceptual diagram illustrating an example of the above-mentioned reference information. The reference information is data in the table format. For example, a "measurement value of sensor" is a value obtained by rounding up the measurement value of the sensor 34 to an integer. TA0 to TA4, TB0 to TB4, and TC0 to TC4 are supply times of the purge gas G1 that are stored in cells corresponding to "measurement value of sensor" and "flow rate". For example, the supply time T1 in FIG. 5A corresponds to "TA4" because "measurement value of sensor" is about 10% and "flow rate" is about 10 liters per minute. For example, data of about 180 seconds may be stored in TA4. Furthermore, for example, the supply time T2 in FIG. 5A corresponds to "TB4" because "measurement value of sensor" is about 10% and "flow rate" is about 20 liters per minute. For example, data of about 80 seconds may be stored in TB4. This configuration enables the supply time to be easily acquired. Note that the initial set value of the flow rate and the flow rate determined by the purge determiner 48 may be any of about 10 liters per minute, about 20 liters per minute, and about 40 liters per minute, and other values.

Returning to the description with reference to FIG. 1, the stocker control device 6 controls the purge device 4 by supplying a control instruction to the purge controller 40. The stocker control device 6 controls the stacker crane 5 to convey a container F to be purged to the purge device 4, and controls the purge device 4 to purge the container F. In the storage shelf 3, a sensor (not shown) that detects that the container F is placed is provided. The purge controller 40 starts purging based on the detection result from the sensor. The sensor is a contact sensor such as a button sensor, and when pressed down by the bottom surface of the container F, detects that the container F is placed on the storage shelf 3. The sensor is communicably connected to the purge controller 40, and supplies the detection result to the purge controller 40. Note that, without providing the sensor that detects that the container F is placed, the stocker control device 6 itself may determine based on a control instruction given to the stacker crane 5 that the container F is placed on the purge device 4, and start purging.

An input interface and a display are connected to the stocker control device 6. Examples of the input interface include an operation panel, a touch panel, a keyboard, a mouse, and a trackball. The input interface detects an input from an operator, and supplies input information to the stocker control device. Furthermore, examples of the above-mentioned display include a liquid crystal display. The display displays images supplied from the stocker control device 6. For example, the stocker control device 6 displays images indicating the operating status, various kinds of settings, and the purging state in the purge stocker 1A on the display.

Figure 6A:
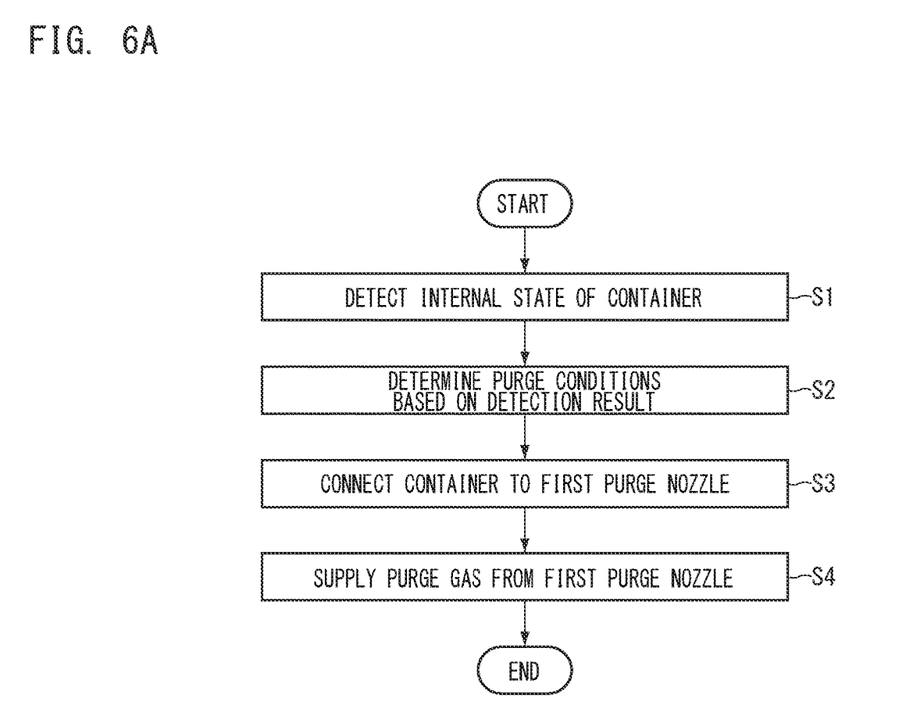
FIGS. 6A and 6B are flowcharts illustrating a purge method according to the first preferred embodiment of the present invention.
Figure 6B:
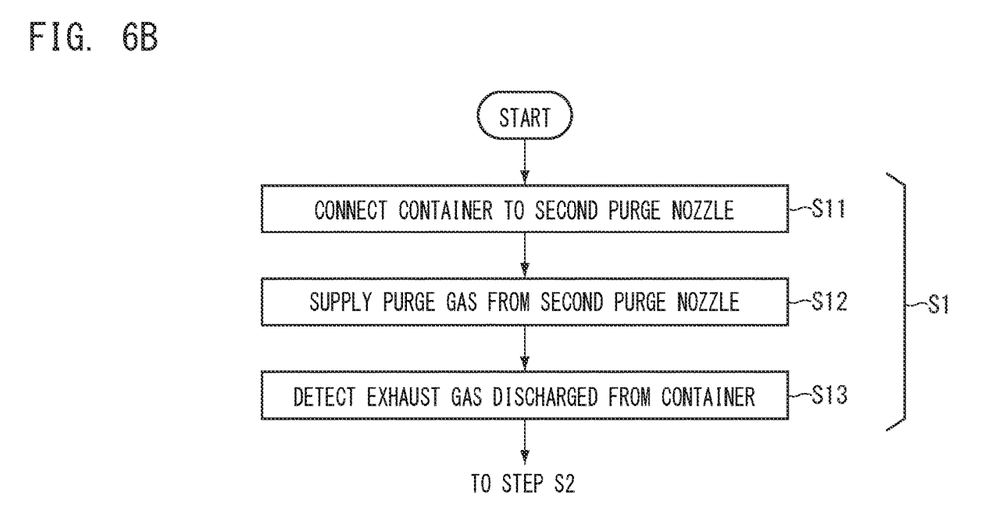

Next, a purge method according to the present preferred embodiment is described based on the operation of the above-mentioned purge device 4. FIG. 6A is a flowchart illustrating the purge method according to the present preferred embodiment. FIG. 6B is a flowchart illustrating an example of processing of Step S1 in FIG. 6A. At Step S1, the internal state detector 8 detects an internal state of a container F. The internal state detector 8 detects the internal state of the container F before a purging process (Step S4 described later) with the purge nozzle 41 (first purge nozzle) is started. For example, at Step S11 in Step S1 illustrated in FIG. 6B, the container F is carried in a loading port Pi by an overhead transport vehicle OHV, and is connected to the purge nozzle 31 (second purge nozzle). At Step S12, the purge controller 40 controls the flow rate control device 33 in the internal state detector 8 to supply the purge gas G1 through the purge nozzle 31. At Step S13, the sensor 34 in the internal state detector 8 detects the exhaust gas G2 discharged from the container F. The sensor 34 detects the detection result to the purge controller 40 (purge determiner 48).

Returning back to FIG. 6A, at Step S2, the purge determiner 48 determines purge conditions (see FIGS. 5A and 5B) based on the detection result from the sensor 34. At Step S3, the stacker crane 5 conveys the container F from the loading port Pi to a storage shelf 3 (purge main body 9), and the container F is connected to the purge nozzle 41 (first purge nozzle). Note that the processing of Step S3 may be performed after Step S1 and before Step S2, or may be performed in parallel to Step S2. At Step S4, the purge controller 40 controls the flow rate control device 43 in the purge main body 9 based on the purge conditions determined by the purge determiner 48 to supply the purge gas G1 through the purge nozzle 41, thus executing a purging process. In this manner, in the purge method according to the first preferred embodiment, the internal state of the container F before connected to the purge nozzle 41 is detected, and the detection result of the internal state is used to determine purge conditions for a purging process using the purge nozzle 41.

Second Preferred Embodiment

Figure 7:
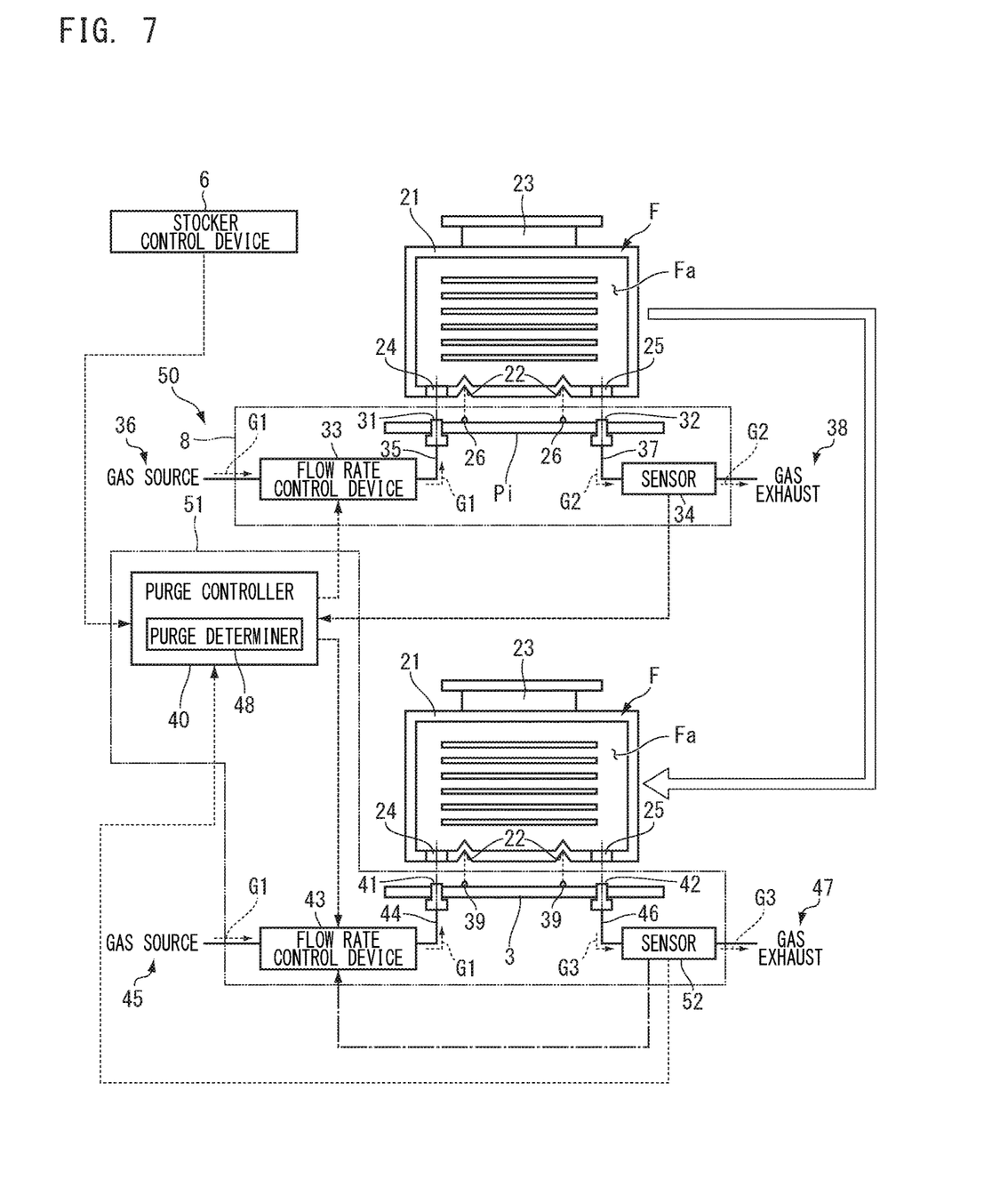
FIG. 7 is a diagram illustrating a purge device according to a second preferred embodiment of the present invention.

A second preferred embodiment of the present invention is described. In the second preferred embodiment, the same components as in the above-mentioned preferred embodiment are denoted by the same reference symbols as appropriate, and descriptions thereof are omitted or simplified. FIG. 7 is a diagram illustrating a purge device 50 according to the second preferred embodiment. In the purge device 50, the purge device 4 and the internal state detector 8 are the same as those in FIG. 2, and a purge main body 51 is different. The purge main body 51 includes a sensor 52 connected to the pipe 46. Similarly to the sensor 34, the sensor 52 detects a composition (for example, the concentration of substance to be removed) of an exhaust gas G3 discharged from a container F.

The sensor 52 is communicably connected to the purge controller 40, and supplies the detection result to the purge controller 40. The purge controller 40 performs feedback control of the flow rate control device 43 based on the detection result from the sensor 52 such that the concentration of the substance to be removed detected by the sensor 52 is equal to or lower than a target value (corresponding to the predetermined value in FIG. 4C). For example, the purge determiner 48 determines, based on the detection result from the sensor 34 in the internal state detector 8, the initial value of the flow rate of the purge gas when the purge main body 9 starts the purging process as the purge conditions, and the purge controller 40 uses the detection result from the sensor 52 in the purge main body 51 to adjust at least one of the flow rate and the supply time of the purge gas. The purge device 50 performs feedback control of the purge conditions based on the detection result from the sensor 52 (internal state of the container F during the purging process), and is thus able to save the purge gas G1 while maintaining the effects of the purging process.

Note that the flow rate control device 43 may perform feedback control instead of the purge controller 40. In this case, the sensor 52 supplies a signal indicating the detection result thereof to the flow rate control device 43 (indicated by the alternate long and short dash line in FIG. 7). The flow rate control device 43 uses the signal to perform feedback control of the flow rate such that the concentration of a substance to be removed has a predetermined value.

Third Preferred Embodiment

Figure 8:
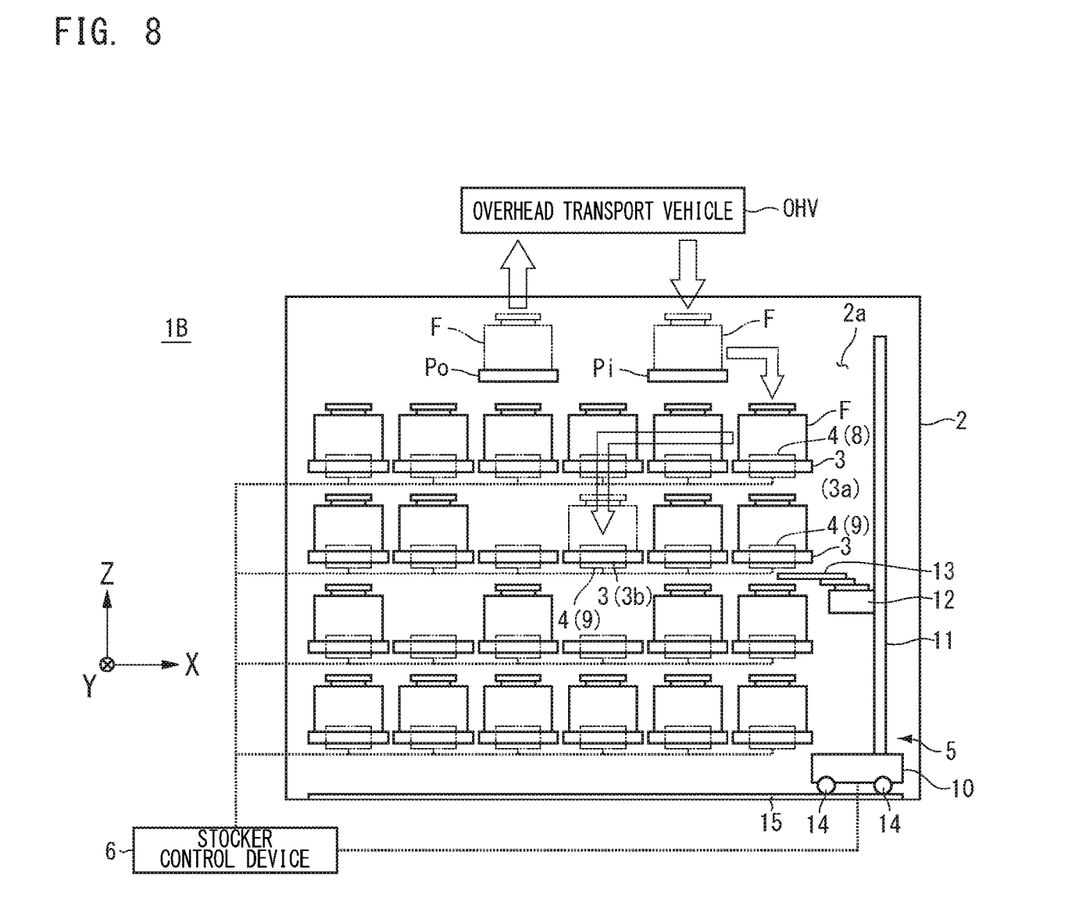
FIG. 8 is a diagram illustrating a purge stocker according to a third preferred embodiment of the present invention.

A third preferred embodiment of the present invention is described. In the third preferred embodiment, the same components as in the above-mentioned preferred embodiments are denoted by the same reference symbols as appropriate, and descriptions thereof are omitted or simplified. FIG. 8 is a diagram illustrating a purge stocker 1B according to the third preferred embodiment. In the third preferred embodiment, the internal state detector 8 in a purge device 60 is disposed in a storage shelf 3. The stacker crane 5 conveys a container F that has been carried in a loading port Pi by an overhead transport vehicle OHV to a storage shelf 3 (denoted by reference symbol 3a) provided with the internal state detector 8 from the loading port Pi.

The internal state detector 8 is similar to that in FIG. 2 and other figures, and detects the internal state of the container F. After the internal state detector 8 detects the internal state of the container F, the stacker crane 5 is controlled by the stocker control device 6 to convey the container F to a storage shelf 3 (denoted by symbol 3b) provided with the purge main body 9 (denoted by symbol 9a). The purge main body 9 performs a purging process on the container F as described above in the first preferred embodiment based on the detection result from the internal state detector 8. As described above, the internal state detector 8 may be provided at a place other than the loading port Pi, and may be provided at any position in a conveyance path of the container F to a purge position at which the purging process is performed by the purge main body 9. For example, when the container F is placed in a temporary storage (buffer) before carried in the purge main body 51, the internal state detector 8 may be provided in the temporary storage. Note that when the purge main body 51 in FIG. 7 is used, any of the purge main bodies 51 may be used as the internal state detector 8.

Note that, in the above-mentioned preferred embodiments, the example in which the purge device is applied to the purge stocker has been described, but the purge device according to the preferred embodiments is applicable also to devices other than the purge stocker. The number of internal state detectors 8 provided for a plurality of purge devices may be one or any number of two or more. For example, in FIG. 8, the internal state detector 8 may be provided for each stage of the storage shelves 3. Furthermore, in the above-mentioned preferred embodiments, the purge determiner 48 is preferably provided in the purge controller 40, but may be provided in another element.

Furthermore, in the above-mentioned preferred embodiments, the internal state detector 8 detects the moisture concentration or the concentration of oxygen in the exhaust gas G2, but the present invention is not limited thereto. For example, when the purge gas G1 is nitrogen gas or the like, the internal state of the container F may be detected by detecting the concentration of the purge gas G1 by the internal state detector 8.

Furthermore, in the above-mentioned preferred embodiments, the purge controller 40 includes, for example, a computer system that is configured or programmed to define or include the purge determiner 48. The purge controller 40 reads a computer program stored in a storage (not shown), and executes various kinds of processing in accordance with the computer program. For example, the computer program causes a computer to execute: control of supplying the purge gas G1 to a container F to be purged through a purge nozzle 41 (first purge nozzle); control of detecting an internal state of the container F before a purging process with the first purge nozzle is started; and control of determining purge conditions for the container F based on a detection result of the internal state of the container F. The computer program may be provided in a state of being recorded in a computer readable storage medium. As far as permitted by the applicable law, the contents of Japanese Patent Application No. 2015-170174 and all the documents cited in the above-mentioned preferred embodiments are incorporated herein by reference.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A purge device comprising:
   a first purge nozzle that supplies a purge gas to a container to be purged;
   an internal state detector that detects an internal state of the container before a purging process with the first purge nozzle is started;
   a purge determiner that determines purge conditions for supplying the purge gas through the first purge nozzle to the container based on a detection result from the internal state detector; and
   a second purge nozzle that supplies a purge gas to the container and is provided in a conveyance path of the container to a purge position at which the container and the first purge nozzle are connected to each other; wherein
   the internal state detector detects the internal state of the container based on a composition of an exhaust gas when the purge gas is supplied through the second purge nozzle to the container.

2. The purge device according to claim 1, wherein the internal state detector detects a concentration of moisture or oxygen in the exhaust gas, and detects the internal state of the container based on the concentration.

3. The purge device according to claim 1, further comprising a flow rate controller that controls a flow rate of the purge gas supplied through the first purge nozzle to the container; wherein
   the purge determiner controls the flow rate controller based on the determined purge conditions.

4. The purge device according to claim 3, wherein the purge conditions include the flow rate of the purge gas and a supply time of the purge gas supplied through the first purge nozzle to the container.

5. A purge stocker comprising:
   the purge device according to claim 1; and
   a shelf that holds the container purged based on the purge conditions.

6. The purge stocker according to claim 5, wherein the internal state detector detects a concentration of moisture or oxygen in the exhaust gas, and detects the internal state of the container based on the concentration.

7. The purge stocker according to claim 5, further comprising a flow rate controller that controls a flow rate of the purge gas supplied through the first purge nozzle to the container; wherein
   the purge determiner controls the flow rate controller based on the determined purge conditions.

8. The purge stocker according to claim 7, wherein the purge conditions include the flow rate of the purge gas and a supply time of the purge gas supplied through the first purge nozzle to the container.

9. A purge method comprising:
   supplying a purge gas through a first purge nozzle to a container to be purged;
   detecting an internal state of the container at a position that is different from the first purge nozzle and before a purging process using the first purge nozzle is started; and
   determining purge conditions for supplying the purge gas through the first purge nozzle to the container based on the detected internal state of the container; wherein
   the internal state of the container is detected based on a composition of an exhaust gas when a purge gas is supplied to the container through a second purge nozzle that is provided in a conveyance path of the container to a purge position at which the container and the first purge nozzle are connected to each other.

* * * * *